United States Patent [19]
Otori et al.

[11] Patent Number: 5,881,005
[45] Date of Patent: Mar. 9, 1999

[54] SEMICONDUCTOR INTEGRATED CIRCUIT DEVICE HAVING A CONSTANT DELAY-TIME CIRCUIT FOR DIFFERENT OPERATING VOLTAGES

[75] Inventors: Hiroshi Otori, Ome; Takesada Akiba, Tachikawa, both of Japan

[73] Assignee: Hitachi, Ltd., Tokyo, Japan

[21] Appl. No.: 782,400

[22] Filed: Jan. 13, 1997

Related U.S. Application Data

[60] Provisional application No. 60/010,227 Feb. 1, 1996.
[51] Int. Cl.$^6$ .................................................. G11C 7/00
[52] U.S. Cl. ........................... 365/205; 365/194; 365/204
[58] Field of Search .................................. 365/205, 194, 365/204; 327/57

[56] References Cited

U.S. PATENT DOCUMENTS

| | | | |
|---|---|---|---|
| 4,855,628 | 8/1989 | Jun ......................................... | 307/530 |
| 5,255,233 | 10/1993 | Izumi ..................................... | 365/207 |
| 5,257,232 | 10/1993 | Dhong et al. .......................... | 361/203 |
| 5,302,867 | 4/1994 | Ahn ....................................... | 307/530 |
| 5,381,374 | 1/1995 | Shiraishi et al. ....................... | 365/203 |
| 5,416,371 | 5/1995 | Katayama et al. ..................... | 327/57 |
| 5,420,823 | 5/1995 | Yonaga et al. ......................... | 365/226 |
| 5,434,821 | 7/1995 | Watanabe et al. ..................... | 365/203 |
| 5,539,700 | 7/1996 | Kawahara et al. ..................... | 365/203 |
| 5,555,210 | 9/1996 | Kato ...................................... | 365/196 |
| 5,577,000 | 11/1996 | Asami ................................... | 365/205 |

FOREIGN PATENT DOCUMENTS

| | | |
|---|---|---|
| 262541 | 10/1987 | Japan . |
| H.03-69136 | 3/1991 | Japan . |
| H.3-295625 | 11/1991 | Japan . |

*Primary Examiner*—David Nelms
*Assistant Examiner*—Hien Nguyen
*Attorney, Agent, or Firm*—Haynes & Boone, L.L.P.

[57] ABSTRACT

The present invention is a method and apparatus for overdriving signals received by a sense amplifier circuit. To this end, an overdrive circuit comprising an n-channel common source switch drives the signal to be sensed for a period of time to a voltage level greater than a normal level. The period of time the signal is overdriven corresponds to the operating voltage of the sense amplifier circuit. Upon completion of the overdriving, a normalization circuit drives the signal to be sensed for a second period of time to the normal level, thereby preparing it for the next memory cycle so that the signals can be once again set to the desired precharge level.

24 Claims, 5 Drawing Sheets

SEMICONDUCTOR INTEGRATED CIRCUIT DEVICE HAVING A CONSTANT DELAY-TIME CIRCUIT FOR DIFFERENT OPERATING VOLTAGES

CROSS REFERENCE

This application claims the benefit of U.S. provisional application Ser. No. 60/010,227, filed Feb. 1, 1996.

BACKGROUND OF THE INVENTION

The invention relates generally to semiconductor circuit design and, more particularly, to a method and apparatus for a memory sensing circuit with a constant delay-time.

Digital logic requires input and output signals to meet defined voltage levels to be interpreted as either "high" or "low." However, typical integrated circuits, or "chips," utilizing digital logic also include signals at many voltage levels. As a result, sense amplifying circuits are utilized to interpret, or "separate," the signals, driving them to either a high or low voltage level, thereby producing the correct voltage level for other digital circuits on the chip. For example, a capacitor-type memory cell for a dynamic random access memory ("DRAM") device utilizes very small bit signals. Sense amplifier circuits residing on the DRAM device separate the bit signals by comparing them to a precharge level, which is defined as a level between the high and low levels of the memory cell. If the level of the bit signal is above the precharge level, then the sense amplifier circuit interprets the signal as a high, or logic 1, signal. If the level of the bit signal is below the precharge level, then the sense amplifier circuit interprets the signal as a low, or logic 0, signal.

As technology progresses, the speed and accuracy of the signal separation performed by sense amplifier circuits becomes more critical. For this reason, chip designers have tried various methods to speed up the signal separation. For example, U.S. Pat. No. 5,257,232 to Dhong et al., teaches a method of overdriving sense amplifier circuits to speed up the signal separation. Although this method succeeds in separating the signals quickly, it has drawbacks. One such drawback is that the overdriving is inaccurate because when the sensing is complete, the signals do not return to their desired precharge level. Instead, the signals return to a level that is offset due to the overshot voltage during the sensing. As a result, the precharge level becomes altered, and the sense amplifier circuits do not interpret the next bit signal incorrectly.

This problem is exacerbated by the fact that modem integrated circuits utilize an external power supply ("VDD") that may be set to different voltage levels. For example, a single chip may operate at an external power supply level between 4.0 V and 2.4 V. Therefore, components used by sense amplifier circuits, as well as a length of time in which a signal is overdriven, must support a wide variance in power supply levels. For example, conventional chips utilize a large p-channel common source switch to control the length of time a signal is overdrawn. This is due to the ability of a p-channel device to pull to a very high voltage and to do so quickly at high power supply levels. However, the operational characteristics of p-channel devices vary dramatically with changes in operating voltages, making a fast and accurate design even more difficult to achieve. Furthermore, p-channel devices vary greatly with changes in operating voltages, being very slow at low operating voltages. Further still, p-channel devices require significantly large amounts of layout space on the chip.

Therefore, what is needed is a method and apparatus for overdriving signals to achieve fast signal separation, while maintaining the accuracy of the sense amplifier operation.

Furthermore, what is needed is a method and apparatus for overdriving signals in chips operating at different power supply levels.

SUMMARY OF THE INVENTION

The present invention, accordingly, is a method and apparatus for overdriving signals received by a sense amplifier circuit. To this end, an overdrive circuit comprising an n-channel common source switch drives the signal to be sensed for a period of time to a voltage level greater than a normal level. The period of time the signal is overdriven corresponds to the operating voltage of the sense amplifier circuit. Upon completion of the overdriving, a normalization circuit drives the signal to be sensed for a second period of time to the normal level, thereby preparing it for the next memory cycle so that the signals can be once again set to the desired precharge level.

A technical advantage achieved with the present invention is that it enables sense amplifiers to separate the bit lines quickly, while maintaining accuracy.

Another technical advantage achieved with the present invention is that the length of time a signal is overdriven is responsive to the voltage level of the external power supply.

Another technical advantage achieved with the present invention is that at low operating voltages, the n-channel common source switch is faster than a p-channel common source switch.

Another technical advantage achieved with the present invention is that the n-channel common source switch is consistent over different operating voltage levels Another technical advantage achieved with the present invention is that the n-channel common source switch has a layout area benefit over a p-channel common source switch.

DETAILED DESCRIPTION OF THE PREFERRED EMBODIMENT

Figure 1:
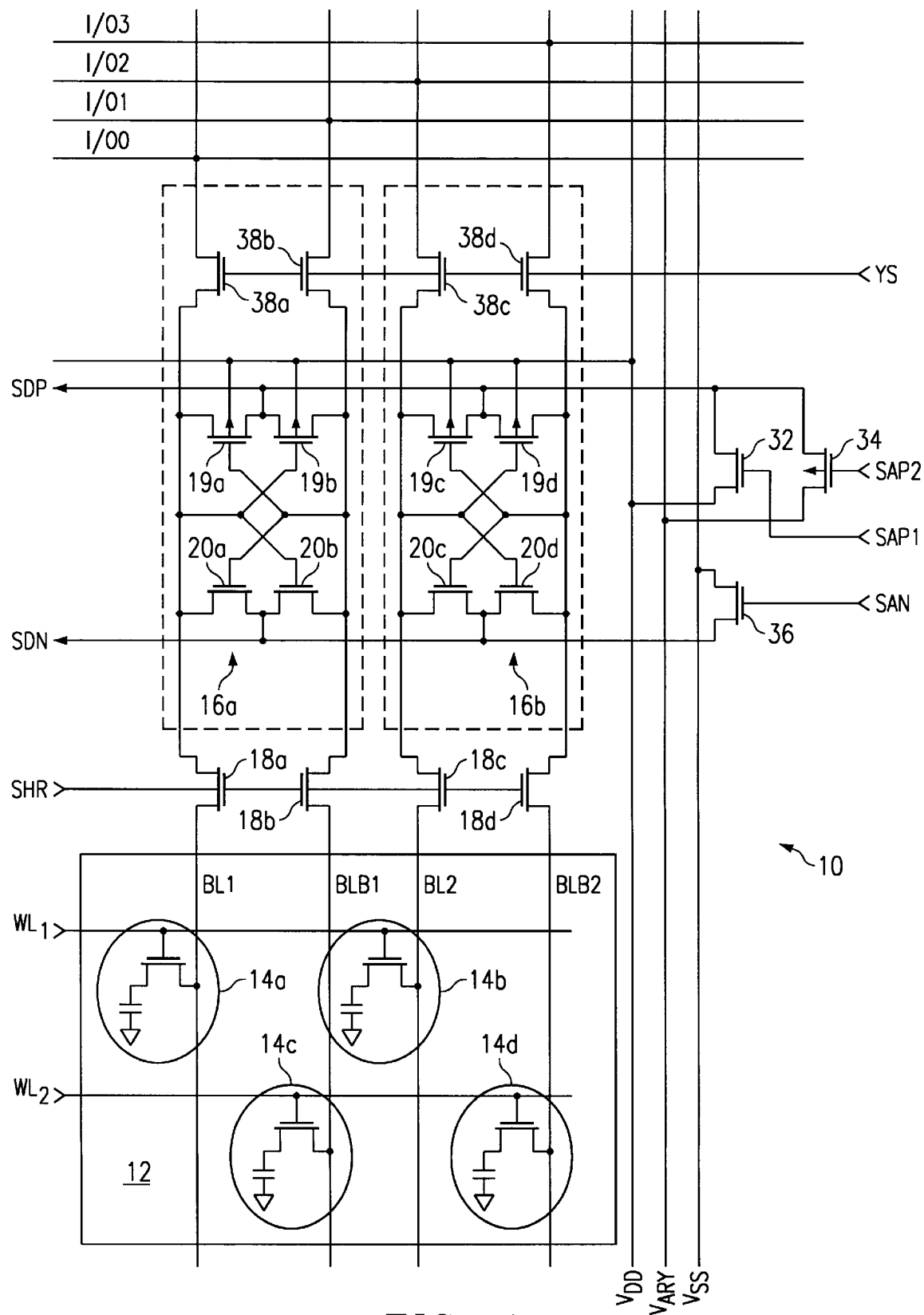
FIG. 1 is a schematic diagram of a portion of a DRAM embodying features of the present invention.

In FIG. 1, the reference numeral 10 refers to a memory device embodying features of the present invention. While in a preferred embodiment of the invention, the device 10 is a 256 Mbit dynamic random access memory ("DRAM"), it should be understood that the present invention is not limited to use with a DRAM, but may be used in conjunction with any integrated circuit device that requires accurate, high speed signal amplification.

The device 10 is connected to an external power supply source (not shown) that supplies a positive power supply (VDD) and a negative, or ground potential, power supply (VSS). The device 10 is comprised of a plurality of conventional enhancement-type field-effect transistors, each having a gate, source, drain and well. It should be understood that, as described herein, each transistor shall be presumed to operate in a saturation mode, unless otherwise specified. The device 10 also includes a set of array blocks of memory cells ("bits"), such as an array block 12. The array block 12, which is representative of the remaining array blocks, comprises bits 14a–14d, which are representative of the remaining bits of the array block. For the remainder of the detailed description, the array block 12 will be described, along with only a few bits, signals and circuits associated with the array block, for ease of description. Therefore, the remaining description is a simplified version of the preferred embodiment and is intended to illustrate, and not to limit, the invention.

The bits 14a–14b and 14c–14d are conventionally selected by word lines WL1 and WL2, respectively. When selected, the bits 14a, 14b, 14c, 14d drive bit lines BL1, BLB1, BL2, BLB2, respectively, in a conventional manner with bit signals (not shown). The bit lines BL1, BLB1 and BL2, BLB2 are also connected to sense amplifiers 16a and 16b, respectively, by pass gates 18a, 18b and 18c, 18d, respectively. In this way, the bit signals can be driven through the sense amplifiers whenever the pass gates 18a–18d are active.

The sense amplifiers 16a and 16b are conventional sense amplifier circuits used to separate the bit signals. Each of the sense amplifiers 16a and 16b comprises a pair of p-channel metal oxide semiconductor ("PMOS") transistors 19a, 19b, and 19c, 19d, respectively, and a pair of n-channel metal oxide semiconductor ("NMOS") transistors 20a, 20b, and 20c, 20d, respectively, cross-coupled between the bit lines BL1, BLB1, and BL2, BLB2, respectively, in a conventional manner. Furthermore, the PMOS transistors 19a–19d have wells biased to VDD and sources connected to a first common source switch ("CSS") transistor 32 and a second CSS transistor 34. The NMOS transistors 20a–20d have wells biased to VSS and sources connected to a third CSS transistor 36. Power lines for both VSS and VDD are already utilized by the sense amplifiers 16a, 16b, as discussed below, and therefore layout area is saved by using these power supplies to bias the transistor wells.

Once the bit signals are separated, a column select signal YS activates four transistors 38a, 38b, 38c, 38d which connect the bit lines BL1, BLB1, BL2, BLB2, to corresponding output lines I/O0, 1/O1, I/O2, I/O3, respectively.

Figure 2:
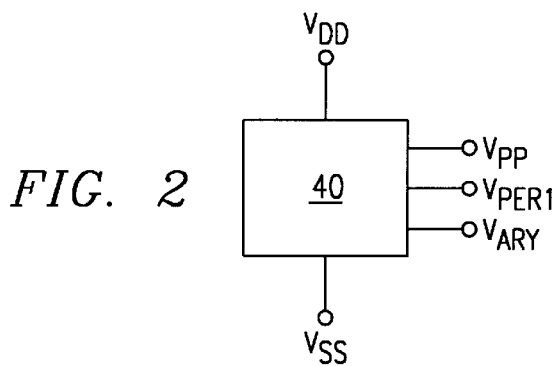
FIG. 2 is a block diagram of a voltage generator used by the DRAM of FIG. 1.

Referring to FIG. 2, in addition to the VDD and VSS power supplies, the device 10 includes a conventional voltage generator circuit 40 for producing three internal voltages VPP, VPERI, and VARY such that VSS<VARY<VPERI<VPP. For the sake of example, VSS, VARY, VPERI, VPP will be deemed to be 0 V, 2.0 V, 2.5 V and 3.6 V, respectively. The voltage level of VDD will be deemed to be in a range between 2.4 V and 4.0 V.

Referring again to FIG. 1, a sense amp control circuit (not shown) drives three signals SAP1, SAP2 and SAN. The signals SAP1, SAP2 and SAN are used to drive a gate of each of the three CSS transistors 32, 34, 36, respectively.

When activated, the first CSS transistor 32 connects the sense amplifier PMOS transistors 19a–19d to VDD (2.4 V–4.0 V), which exceeds the normal high voltage level for a sense amplifier to drive a bit signal, and therefore overdrives the bit signal. Furthermore, the composition (i.e., NMOS or PMOS) of the second CSS transistor 34 affects the speed at which the bit signals are driven, as shown below. The second CSS transistor 34, when activated, connects the sense amplifier PMOS transistors 19a–19d to VARY (2.0 V), which is a target high voltage level for a sense amplifier to drive a bit signal. Likewise, when activated, the third CSS transistor 36 connects the sense amplifier NMOS transistors 20a–20d to VSS (0.0 V), which is a target low voltage level for a sense amplifier to drive a bit signal.

Figure 3:
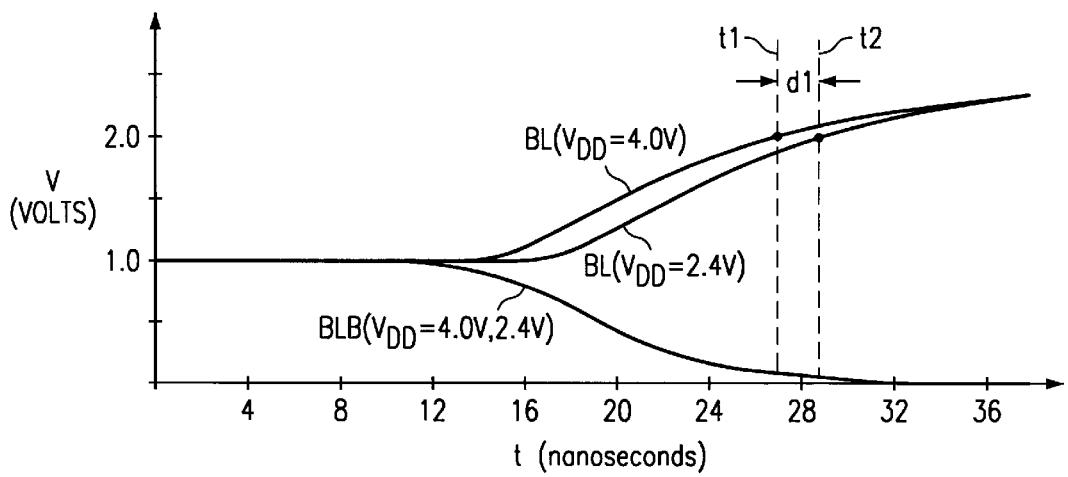
FIG. 3 is a timing diagram of an NMOS transistor of a first implementation of the DRAM of FIG. 1.

Referring also to FIG. 3, a time vs. voltage diagram showing two bit signals BL, BLB on the bit lines BL1, BLB1, respectively, being separated by the sense amplifier 16a connected to the first CSS transistor 32 illustrates the operation of a first implementation of the present invention when the transistor 32 is an n-channel transistor. Of particular concern is the time in which the bit signal BL reaches the target high voltage of VARY (2.0 V) and the bit signal BLB reaches the target low voltage of VSS (0.0 V). As shown in FIG. 3, the bit signal BLB has the identical waveform for both when VDD approaches 2.4 V and VDD approaches 4.0 V. However, the bit signal BL has a different waveform when VDD equals 2.4 V (BL(VDD=2.4 V)) than when VDD approaches 4.0 V (BL(VDD=4.0 V)). Considering a time t1, when the bit signal BL(VDD=4.0 V) reaches the target high voltage, and a time t2, when the bit signal BL(VDD=2.4 V) reaches the target high voltage, a difference d1 between the times +1 and +2 is about 2 nanoseconds.

Figure 4:
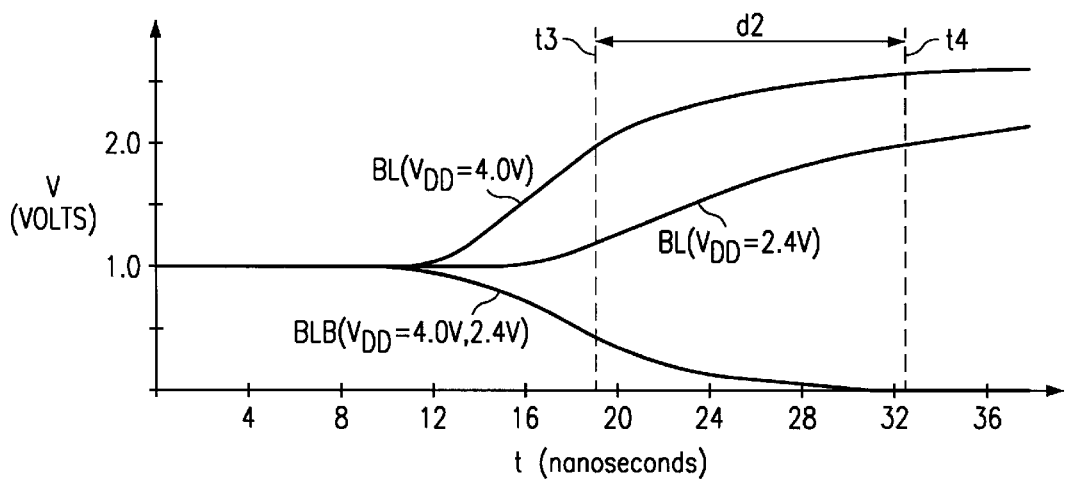
FIG. 4 is a timing diagram of a PMOS transistor implementation for comparison with the NMOS transistor implementation of FIG. 3.

Referring to FIGS. 1 and 4, a time vs. voltage diagram of the two bit signals BL, BLB in the same circuit discussed above with reference to FIG. 3, except that the first CSS transistor 32 is a p-channel transistor, illustrates the improvement of the implementation of FIG. 3 over a conventional PMOS implementation. The bit signal BLB still has the identical waveform for both when VDD approaches 2.4 V and VDD approaches 4.0 V. However, the bit signal BL has a different waveform when VDD approaches 2.4 V (BL(VDD=2.4 V)) than when VDD approaches 4.0 V (BL (VDD=4.0 V)). Considering a time t3, when the BL(VDD= 4.0 V) reaches the target high voltage, and a time t4, when the BL(VDD=2.4 V) reaches the target high voltage, a difference d2 between the times t3 and t4 is about 14 nanoseconds. Having thus described the specific differences between the implementations of FIGS. 3 and 4, e.g., the difference d2 (FIG. 4) is much greater than the difference d1 (FIG. 3), it will be appreciated that the first implementation, wherein the first CSS transistor 32 is an NMOS transistor, is used according to this invention.

Figure 5:
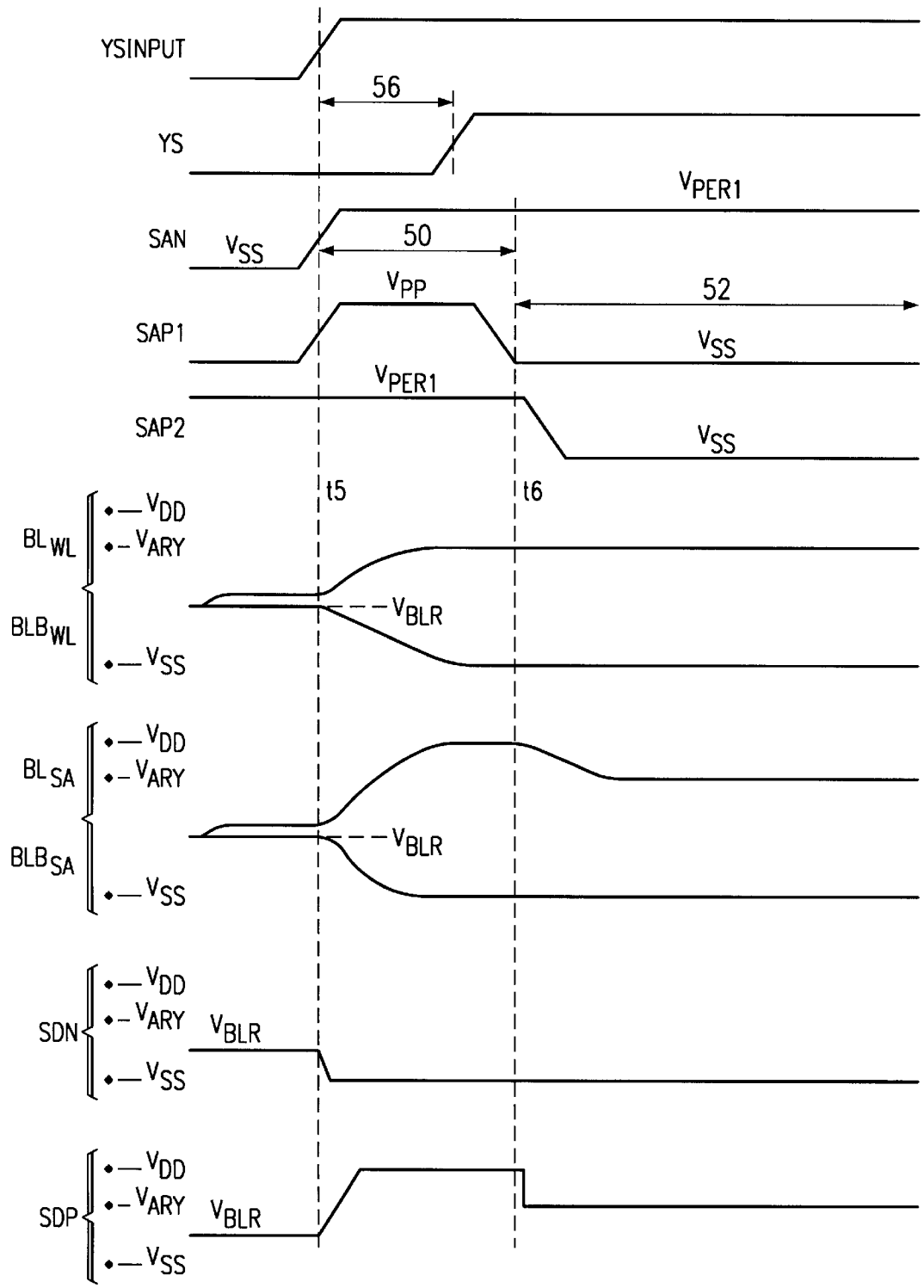
FIG. 5 is a timing diagram of the signals of FIG. 1.

Referring to FIGS. 1 and 5, in the first implementation, a sensing operation is initiated at a time t5 by the activation of both the SAN and SAP1 signals, thus beginning an overdrive period 50. In response to the beginning of the overdrive period 50, the first and third CSS transistors 32, 36 are enabled, activating the two latching signals SDP and SDN by connecting them to the VDD and VSS power lines, respectively. However, unlike the SAN and SAP2 signals, the SAP1 signal has a high voltage level of VPP (3.6 V). As a result, when VDD approaches the 3.0 V–4.0 V range, the first CSS transistor 32 receives a gate voltage of VPP, which is less than VDD plus a transistor threshold voltage VTH, thereby maintaining the first CSS transistor in a saturation mode and limiting its performance due to the relatively low gate voltage. Alternatively, when VDD approaches 2.4 V, the gate voltage of the first CSS transistor 32 is higher than VDD+VTH, which causes the first CSS transistor to enter a linear mode and a current (not shown) flowing through the CSS transistor is linearly proportional to VDD. Therefore, even if VDD varies between 2.4 V and 4.0 V, the overdrive period 50 required for the bit line BL to reach the target high voltage is consistent because of the switching operation between the linear and saturation modes of the n-channel transistor 32. Accordingly, it is easy to control the overdrive period 50. Furthermore, as will be discussed in greater detail below, it is easy to control the timing of the YS signal because the time for the bit line BL to reach the target high voltage (2.0 V) is relatively consistent.

In response to the activation of the two latching signals SDP and SDN, the bit signals on the bit lines begin to separate. However, due to the length of the bit lines and the capacitive load of all the memory cells and sense amplifier circuits connected thereto, the bit signals at a portion of the bit lines located in the sense amplifier area behave differently from the bit signals at a portion of the bit lines located near the lower word lines. For example, considering the two bit lines BL1 and BLB1, bit signals BL and BLB located at a portion of the bit lines in the sense amplifier 16a are represented in the timing diagram by waveforms designated $BL_{SA}$ and $BLB_{SA}$, respectively. Likewise, the bit signals BL and BLB located at the portion of the bit lines near the word line WL2 are represented in the timing diagram by waveforms designated $BL_{WL}$ and $BLB_{WL}$, respectively. Comparing the waveforms $BL_{WL}$, $BLB_{WL}$ and $BL_{SA}$, $BLB_{SA}$, the bit line portions located in the sense amplifier 16a are the least affected by the capacitive load of the memory cells and sense amplifier circuits. As a result, the bit signals at the sense amplifier 16a separate quicker than the bit signals at the word line WL2.

The overdrive period 50 is maintained until both the $BL_{WL}$ and the $BL_{SA}$ bit lines reach the target high voltage (VARY). When the overdrive period 50 is completed at a time t6, the SAP1 signal is deactivated and the SAP2 signal is activated and a normalization period 52 begins. During the normalization period 52, the first CSS transistor 32 is disabled and the second CSS transistor 34 is enabled, connecting the latching signal SDP to the VARY power line. The normalization period 52 brings the bit signals BL and BLB to their desired VARY voltage level, so that during an equalization period (not shown) the bit signals will accurately return to a precharge level VBLR, which is exactly half-way between VARY and VSS.

When both the bit signals BL, BLB reach the target high and low voltages, respectively, the YS signal is activated. In this way, the bit lines BL1, BLB1, BL2, BLB2, are connected to their corresponding output lines I/O0, I/O1, I/O2, 1/O3, respectively. The speed at which the bit signals BL, BLB reach their corresponding output lines directly affects the speed of the device 10 (FIG. 1). Therefore, the sooner the YS signal is activated, the faster the device 10 will operate. However, if the YS signal is activated too quickly, the bit signals will not have reached their target levels, and the bit signals will be corrupted. Therefore, a delay period 56 from a YSINPUT signal activation, which corresponds to the beginning of the sensing operation to the YS signal activation, is critical for optimizing both the accuracy and speed of the device 10. Because, as mentioned above, the overdrive period 50 is relatively consistent for various levels of VDD, the delay period 56 can be fixed to a relatively constant value without regard to the large variance in overdrive voltage. Therefore, it is easy to control the timing of the YS signal.

Figure 6:
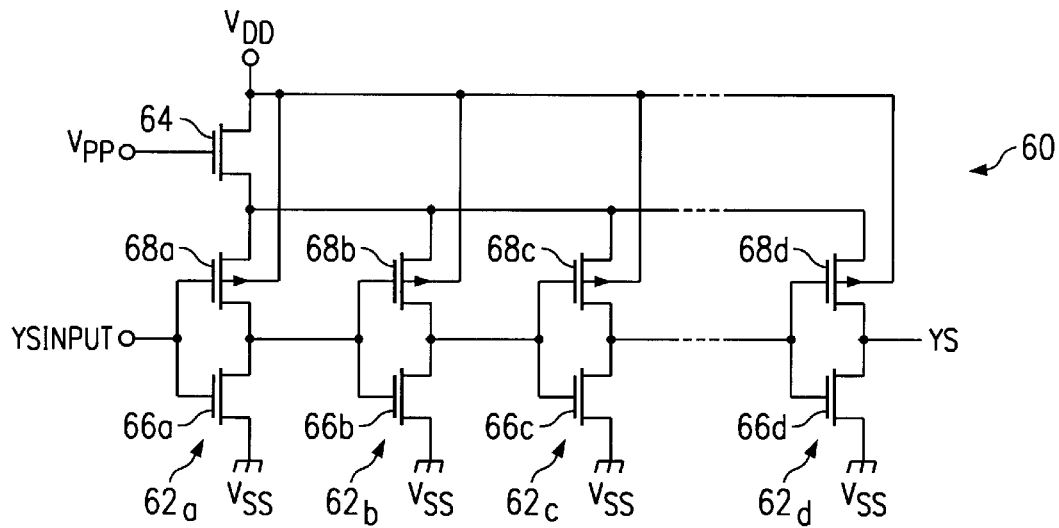
FIG. 6 is a schematic diagram of a first delay circuit for the DRAM of FIG. 1.

Referring to FIG. 6, a first delay circuit 60 is used to activate the YS signal after the delay period 56 (FIG. 5). The delay circuit 60 comprises a plurality of inverters, represented by inverters 62a, 62b, 62c, 62d, and a CSS transistor 64. Each of the inverters 62a, 62b, 62c, 62d comprises an NMOS transistor 66a, 66b, 66c, 66d and a PMOS transistor 68a, 68b, 68c, 68d, respectively, configured in a conventional manner, except that each PMOS transistor has a well biased to VDD and a source connected to the CSS transistor 64.

The CSS transistor 64 is continually activated because the gate of the CSS transistor is tied to VPP (3.6 V). As a result, when VDD approaches 3.0 V–4.0 V, the gate voltage of VPP is less than VDD plus the threshold voltage of transistor 64(VTH), thereby maintaining the CSS transistor 64 in a saturation mode and limiting its performance due to the relatively low gate voltage. However, when VDD approaches 2.4 V, the gate voltage of VPP is higher than VDD+VTH, which causes the CSS transistor 64 to operate in a linear mode and its performance is not limited because of the relatively high gate voltage. Therefore, the delay period 56 may be relatively constant even if VDD varies greatly. When in the linear mode, a current (not shown) flowing through the CSS transistor 64 is linearly proportional to VDD. As a result, by having a lower current flowing through the CSS transistor 64 when VDD approaches 2.4 V than when VDD approaches 3.0 V–4.0 V, the speed of the inverters 62a, 62b, 62c, 62d is slowed down, thereby increasing the delay period 56 (FIG. 5). This characteristic is similar to that of the overdrive period 50 wherein the time t2 is slightly behind the time t1 (FIG. 3). To mirror these characteristics, the timing of the YS signal is automatically adjusted by using the delay circuit 60. In this way, the first delay circuit 60 is responsive to the different operating voltages of VDD. Furthermore, because the well of each PMOS transistor 68a, 68b, 68c, 68d is biased to VDD, and the source are connected to VDD through an NMOS transistor, the PMOS transistors perform in a manner similar to the PMOS transistors 19a–19d of the sense amplifiers 16a, 16b (FIG. 1), regardless of the VDD voltage level, thereby matching the delay period 56 to the time required for the bit signals BL, BLB (FIG. 5) to reach the target levels.

Figure 7:
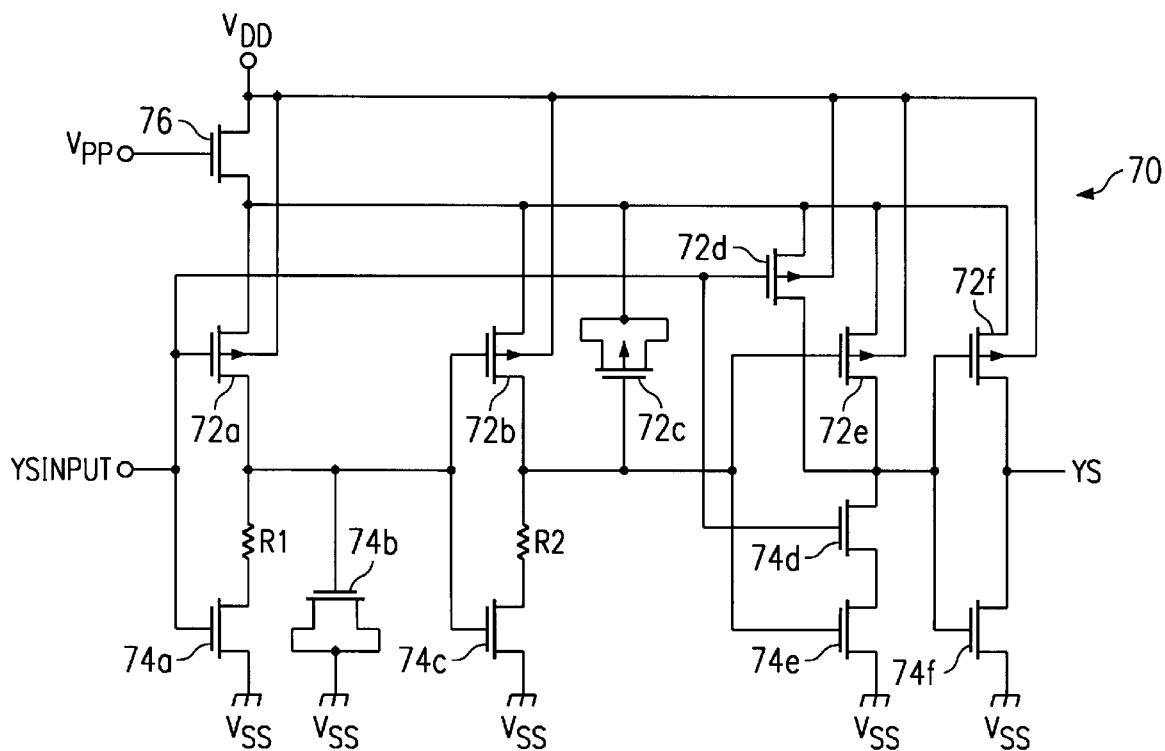
FIG. 7 is a schematic diagram of a second delay circuit for the DRAM of FIG. 1.

Referring to FIG. 7, alternatively, a second delay circuit 70 may be used to activate the YS signal after the delay period 56 (FIG. 5) following the activation of the YSINPUT signal. The delay circuit 70 comprises a plurality of components, including PMOS transistors 72a–72f, NMOS transistors 74a–74f, resistors R1, R2, and a CSS transistor 76. The components are configured in a conventional manner to produce a resistive-capacitive delay. Furthermore, each PMOS transistor 72a–72f has a well biased to VDD and a source connected to the CSS transistor 76. The CSS transistor 76 is continually activated because its gate is tied to VPP (3.6 V). As a result, when VDD approaches 3.0 V–4.0 V, the gate voltage of VPP is less than VDD+VTH, thereby maintaining the CSS transistor 64 in saturation mode and limiting its performance due to the comparatively low gate voltage. However, when VDD approaches 2.4 V, the gate voltage of VPP is higher than VDD+VTH, which causes the CSS transistor 64 to operate in a linear mode and its performance is not limited because of the comparatively high gate voltage. Therefore, the delay period 56 is allowed to be almost constant, even if VDD has a large variance.

Furthermore, in the case of linear mode operation, a current (not shown) flowing through the CSS transistor 76 is linearly proportional to VDD. As a result, by having a lower current flowing through the CSS transistor 76 when VDD approaches 2.4 V than when VDD approaches 4.0 V, the delay period 56 slightly lengthens. This characteristic is similar to that of the overdrive period 50 wherein the time t2 is slightly longer than the time t1 (FIG. 3). For the same characteristics, the timing of the YS signal is automatically adjusted by using the delay circuit 70 as the delay circuit 60 (FIG. 6).

Figure 8:
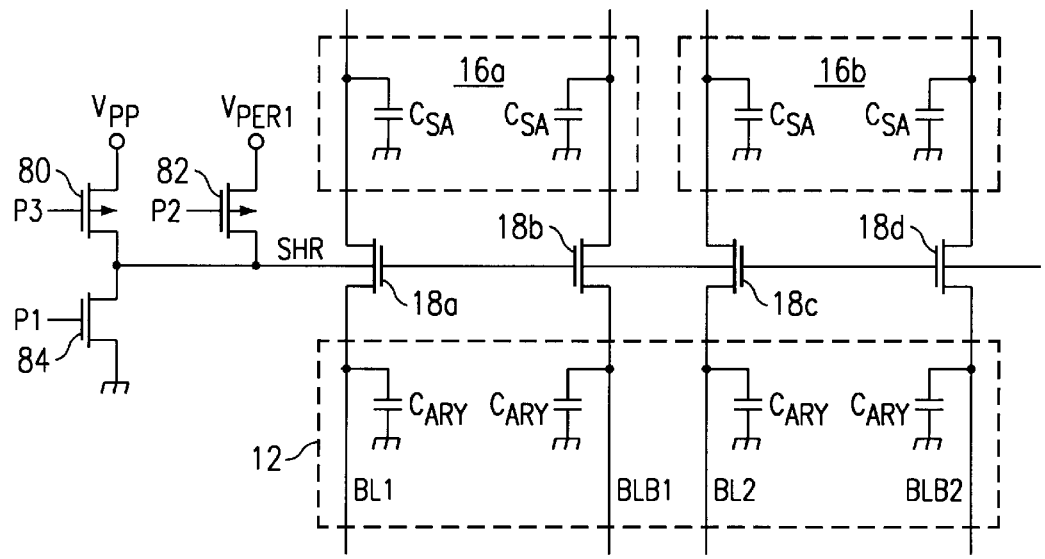
FIG. 8 is a schematic diagram of an improved pass gate driver circuit of the present invention.

Referring to FIG. 8, a pass signal SHR controls the pass transistors 18a–18d. Conventionally, the pass signal SHR is driven by an inverter (not shown) which is controlled by a pass control signal (also not shown). In the conventional inverter, the pass signal SHR activates at the VPP voltage level, thereby decreasing an effective resistance of the pass gates. In the preferred embodiment, however, the SHR signal is not controlled by an inverter, but instead is controlled by a first PMOS transistor 80, with a source connected to VPP, a second PMOS transistor 82, with a source connected to VPERI, and an NMOS transistor 84, with a source connected to VSS. The three transistors 80, 82, 84 are separately controlled by first, second and third pass control signals P1, P2, P3, respectively.

When the pass signal SHR enables the pass transistors 18a–18d, the bit lines BL1, BLB1 and BL2, BLB2 are connected from the array block 12 to the sense amplifiers 16a and 16b, respectively. However, as mentioned earlier, with reference to FIG. 5, the bit lines, have a high capacitive load due to all the memory cells and sense amplifier circuits connected thereto. Therefore, to accurately model the bit lines BL1, BLB1, BL2, BLB2, the capacitive load due to the memory cells connected to each bit line is represented by a capacitor CARY and the capacitive load due to the sense amplifier circuits connected to each bit line is represented by a capacitor CSA.

Figure 9:
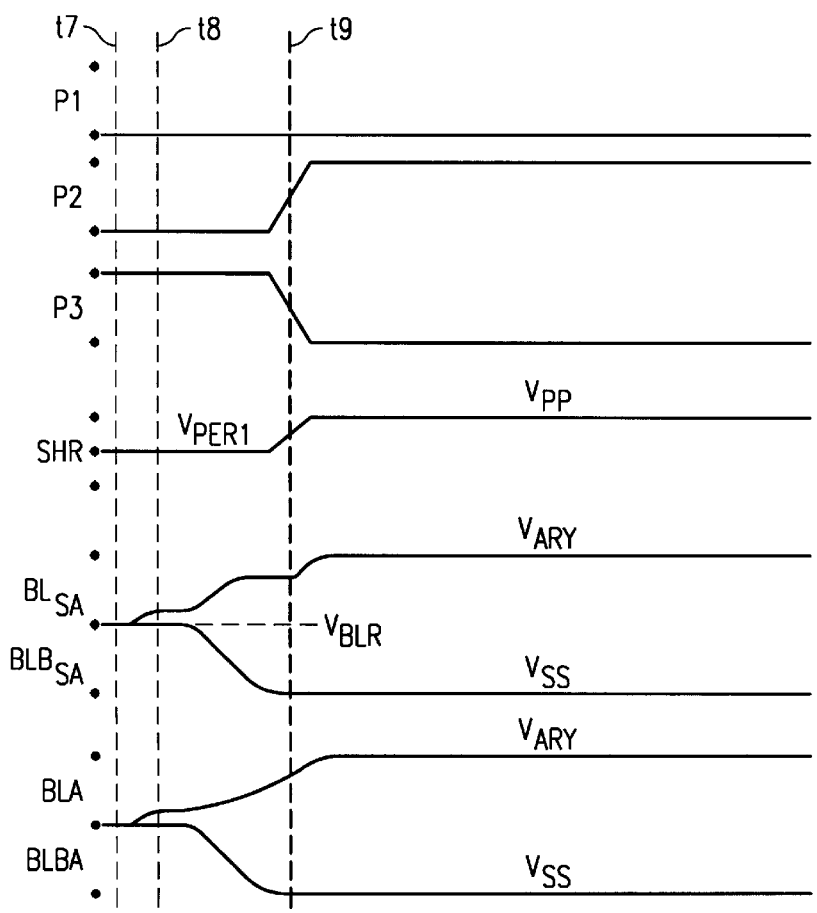
FIG. 9 is a timing diagram of the improved pass gate driver circuit of FIG. 8.

Referring also to FIG. 9, in operation, the three transistors 80, 82, 84 are utilized to relieve the effects of the capacitive loads CARY and CSA. Initially, at a time t7, the pass control signals P1, P2 are low, the pass control signal P3 is high, and only the PMOS transistor 82 is enabled. As a result, the pass signal SHR is at the VPERI (2.5 V) level. Also at the time t7, bit signals $BL_A$, $BLB_A$ and $BLB_{SA}$ (representing the bit signals located in the array and the sense amplifiers, respectively) are near the precharge level VBLR. At a time t8, bit line sensing is started and the bit signals $BL_A$, $BLB_A$ and $BL_{SA}$, $BLB_{SA}$ begin to separate. Because the pass transistors 18a–18d are in the saturation mode, the total effective capacitance of the bit lines BL1, BLB1, BL2, BLB2 is less than CSA plus CARY. This capacitive load is relatively low and thereby allows the bit signals $BL_A$, $BLB_A$ and $BL_{SA}$, $BLB_{SA}$ to separate quickly.

Thereafter, at a time t9, the pass control signals P2 and P3 transition, thereby disabling the PMOS transistor 82 and enabling the PMOS transistor 80. As a result, the pass signal rises to the VPP (3.6 V) level. Because the pass transistors 18a–18d are driven at the VPP (3.6 V) level, they enter a linear mode and the total effective capacitance of the bit lines BL1, BLB1, BL2, BLB2 is equal to about CSA plus CARY. The pass transistors 18a–18d, with a relatively high transistor gate level of VPP, provides a low resistive path between the block array 12 and the sense amplifiers 16a, 16b so that the bit signals $BL_A$, $BLB_A$ and $BL_{SA}$, $BLB_{SA}$ can be pulled to their target high (VARY) or low (VSS) voltage.

Although illustrative embodiments of the present invention have been shown and described, a latitude of modification, change and substitution is intended in the foregoing disclosure, and in certain instances, some features of the invention will be employed without a corresponding use of other features. For example, an alternative embodiment may be created for controlled overdriving of the low-going bit line with a voltage that exceeds VSS in the negative direction. Furthermore, additional buffers, drivers, delay circuits and other circuits may be added to the illustrative embodiment without altering the scope of the invention. Accordingly, it is appropriate that the appended claims be construed broadly and in a manner consistent with the scope of the invention.

What is claimed is:

1. A semiconductor memory comprising:

a pair of bit lines;

a plurality of word lines;

a plurality of dynamic memory cells, each of which is coupled to one of said pair of bit lines and one of said plurality of word lines;

a sense amplifier including a pair of PMOS transistors and a pair of NMOS transistors, each of said pairs of PMOS and NMOS transistors having sources coupled in common, drains coupled to said pair of bit lines, respectively, and gates cross-coupled to said drains, respectively;

a first external terminal for receiving a first external supply voltage;

a first switch NMOS transistor, having a source coupled to said sources of said pair of PMOS transistors and a drain coupled to said first external terminal; and a first generator which generates a first internal supply voltage, wherein the level of said first internal supply voltage is set up on the basis of a circuit ground potential so that the level of said first internal supply voltage is stabilized with respect to said first external supply voltage, wherein a gate of said first switch transistor is supplied with said first internal supply voltage so that said first switch transistor is activated.

2. The semiconductor memory according to claim 1, wherein a well of each of said pair of PMOS transistors is biased with said first external supply voltage.

3. The semiconductor memory according to claim 1, wherein said first switch transistor is driven in a saturation mode while said first external supply voltage has a first level, and wherein said first switch transistor is driven in a linear mode while said first external supply voltage has a second level that is lower than said first level.

4. The semiconductor memory according to claim 1, further comprising:

a second generator which generates a second internal supply voltage being lower than said first internal supply voltage; and a second switch transistor coupled between said sources of said pair of PMOS transistors and an output terminal of said second voltage generator, wherein said sense amplifier provides said pair of bit lines with a pair of complementary signals having a high side voltage and a low side voltage on the basis of information stored in a memory cell selected from said plurality of dynamic memory cells, wherein, in a first period, said high side voltage is risen in response to said first switch transistor being enabled, and wherein, in a second period following said first period, said high side voltage of said pair of complementary signals approaches said second internal supply voltage in response to said second switch transistor being enabled.

5. A semiconductor memory comprising:
an external terminal for receiving a first external supply voltage;
a PMOS transistor having a gate coupled to an input terminal and a drain coupled to an output terminal;
an NMOS switch transistor having a drain coupled to said first external terminal and a source coupled to a source of said PMOS transistor; and
a first generator for generating an internal supply voltage stabilized with respect to said external supply voltage,
a first generator which generates an internal supply voltage,
wherein the level of said internal supply voltage is set up on the basis of a circuit ground potential so that the level of said internal supply voltage is stabilized with respect to said external supply voltage,
wherein a gate of said switch NMOS transistor receives said first internal supply voltage so that said NMOS switch transistor is enabled, and
wherein a well of said PMOS transistor is biased with said first external supply voltage.

6. A method for amplifying a signal to a first voltage level comprising overdriving the signal to a second voltage level by using a first NMOS switch transistor for a discrete period of time, wherein the second voltage level is determined by an externally applied voltage source, the level of which is variable between an external high level and an external low level, and biasing a well of a first PMOS transistor with the second voltage level.

7. The method of claim 6 further comprising connecting a gate of the first NMOS switch transistor to a signal having an active high level equal to a third voltage level, the third voltage level lying between the external high level and the external low level and remaining constant, regardless of the level of the externally applied voltage source.

8. The method of claim 7 wherein the first NMOS switch transistor operates in a linear mode when the voltage level of the externally applied voltage source is near the external low level.

9. The method of claim 7 further comprising limiting a current flowing through the first NMOS switch transistor by applying the third voltage level to the gate of the first NMOS switch transistor when the voltage level of the externally applied voltage source is near the external high level.

10. The method of claim 6 further comprising creating a delay, the length of which is determined by the voltage level of the externally applied voltage source.

11. The method of claim 10 wherein the delay is created utilizing a second PMOS transistor having a well biased to the second voltage level and a second NMOS switch transistor.

12. The method of claim 11 further comprising connecting a gate of the first NMOS switch transistor to a first signal and connecting a gate of the second NMOS switch transistor to a second signal, wherein both the first and second signals have an active high level equal to a third voltage level, the third voltage level lying between the external high level and the external low level and remaining constant, regardless of the voltage level of the externally applied voltage source.

13. The method of claim 12 further comprising operating the first and second NMOS switch transistors in a linear mode when the externally applied voltage source is near the external low level.

14. The method of claim 12 further comprising limiting the first and second NMOS switch transistors by the third voltage level applied to the gate of the NMOS switch transistors when the externally applied voltage source is near the external high level.

15. A method for controlling a pass transistor, said method comprising driving a gate of the pass transistor with a first voltage so that the pass transistor is in a saturation mode and then driving the gate of the pass transistor with a second voltage so that the pass transistor is in a linear mode, wherein the pass transistor divides a bit line into a lower portion and a higher portion, each portion having a capacitive load associated therewith, and the pass transistor has a resistance associated therewith so that when the transistor is in the saturation mode, a capacitive load for the entire bit line is reduced and when the transistor is in the linear mode, the resistance of the transistor is reduced.

16. The method of claim 15 wherein the lower portion of the bit line is connected to a memory bit and the higher portion of the bit line is connected to a sense amplifier circuit.

17. An apparatus for controlling a pass transistor, said apparatus comprising a first circuit for selectively driving a gate of the pass transistor with a first voltage so that the pass transistor is in a saturation mode and a second circuit for driving the gate of the pass transistor with a second voltage so that the pass transistor is in a linear mode, wherein the first and second circuits drive the gate of the pass transistor at different times, wherein the pass transistor divides a bit line into a lower portion and a higher portion, each portion having a capacitive load associated therewith, and the pass transistor has a resistance associated therewith so that when the transistor is in the saturation mode, a capacitive load for the entire bit line is reduced and when the transistor is in the linear mode, the resistance of the transistor is reduced.

18. The apparatus of claim 17 wherein the lower portion of the bit line is connected to a memory bit and the higher portion of the bit line is connected to a sense amplifier circuit.

19. A semiconductor memory comprising:
a pair of bit lines;
a plurality of word lines;
a plurality of dynamic memory cells, each of which is coupled to one of said pair of bit lines and one of said plurality of word lines;
a sense amplifier including a pair of PMOS transistors and a pair of NMOS transistors, each of said pairs of PMOS and NMOS transistors having sources coupled in common, drains coupled to said pair of bit lines, respectively, and gates cross-coupled to said drains, respectively;
a first terminal for receiving a first voltage;
a first MOS transistor of N-channel type, having a source-drain path provided between said first terminal and sources of said pair of PMOS transistors, which supplies said sources of said pair of PMOS transistors with a second voltage being lower than said first voltage;
a second terminal for receiving a third voltage being lower than said second voltage; and
a second MOS transistor having a source-drain path provided between said second terminal and sources of said pair of PMOS transistors,
wherein said sense amplifier provides said pair of bit lines with a pair of complementary signals having a high side voltage and a low side voltage on the basis of information stored in a memory cell selected from said plurality of dynamic memory cells, wherein, in a first period, said high side voltage is risen by said second voltage, and wherein, in a second period following said first period, said high side voltage of said pair of complementary signals approaches to said third voltage.

20. A semiconductor memory according to claim 19, wherein said first voltage corresponds to an external supply voltage, and wherein said first MOS transistor is driven in a saturation made so that said second voltage is stabilized with respect to said external supply voltage.

21. A semiconductor memory according to claim 20, further comprising:

a third terminal for receiving a fourth voltage;

a third MOS transistor, having a source-drain path provided between said third terminal and sources of said pair of NMOS transistors, which supplies said sources of said pair of NMOS transistors with said fourth voltage;

wherein, in said second period, said low side voltage of said pair of complementary signals approaches to said fourth voltage.

22. A semiconductor memory according to claim 21, further comprising:

a first generator which generates a fifth voltage supplied to a gate of said first MOS transistor, wherein the level of said fifth voltage is set up on the basis of a circuit ground potential so that said fifth voltage is stabilized with respect to said first voltage.

23. A semiconductor memory according to claim 22, wherein said fourth voltage corresponds to said circuit ground voltage.

24. A semiconductor memory according to claim 22, further comprising:

a second generator which generates said third voltage, wherein the level of said third voltage is set up on the basis of said circuit ground potential so that said third voltage is stabilized with respect to said first voltage.

* * * * *